United States Patent [19]

Nicolai et al.

[11] Patent Number: 5,775,051
[45] Date of Patent: Jul. 7, 1998

[54] FRAME MEMBER FOR A SWITCHGEAR CABINET FRAME

[75] Inventors: Walter Nicolai, Buseck; Heinrich Strackbein, Biebertal; Udo Münch, Sinn; Adam Pawlowski, Dillenburg; Horst Besserer, Herborn; Matthias Schüler, Dietzhölztal; Markus Neuhof, Ehringshausen, all of Germany

[73] Assignee: Rittal-Werk Rudolf Loh GmbH & Co. KG, Herborn, Germany

[21] Appl. No.: 836,568

[22] PCT Filed: Nov. 2, 1995

[86] PCT No.: PCT/EP95/04289

§ 371 Date: May 2, 1997

§ 102(e) Date: May 2, 1997

[87] PCT Pub. No.: WO96/14731

PCT Pub. Date: May 17, 1996

[30] Foreign Application Priority Data

Nov. 5, 1994 [DE] Germany .................. 44 39 551.5

[51] Int. Cl.[6] .................................................. E04C 3/32
[52] U.S. Cl. ........................... 52/731.1; 52/281; 52/731.2; 52/731.4; 52/731.5; 52/731.8; 52/731.9; 52/733.2

[58] Field of Search .............. 52/720.1, 731.1–731.8, 52/732.1–732.3, 733.2, 281, 731.9

[56] References Cited

U.S. PATENT DOCUMENTS 3,087,768  4/1963  Anderson et al. .

FOREIGN PATENT DOCUMENTS

| 2356033 | 1/1978 | France . |
| 1962561 | 5/1971 | Germany . |
| 2401371 | 7/1974 | Germany .................. 312/265.1 |
| 8107658 | 7/1981 | Germany . |
| 3344598 | 9/1984 | Germany . |
| 8703695 | 2/1988 | Germany . |
| 4036664 | 5/1992 | Germany . |
| 4132803 | 4/1993 | Germany . |
| 4336204 | 4/1995 | Germany . |
| 2253456 | 9/1992 | United Kingdom . |

*Primary Examiner*—Robert Canfield
*Attorney, Agent, or Firm*—Speckman Pauley Petersen & Fejer

[57] ABSTRACT

A frame member for a switchgear cabinet frame, designed as an inwardly open hollow section having two perpendicular sides that form outer sides of the frame. An easily constructed frame member combines features that provide a simple solution to meeting many requirements of a switchgear cabinet frame.

17 Claims, 2 Drawing Sheets

FRAME MEMBER FOR A SWITCHGEAR CABINET FRAME

BACKGROUND OF THE INVENTION

1. Field of the Invention

This invention relates to a frame member for a switchgear cabinet frame, which has two profiled sides positioned vertically with respect to one another forming outer sides of the frame, and which is designed as a hollow profile section open towards an inner side.

2. Description of Prior Art

Frame members, designed as closed hollow profiles, are known for the frame of a switchgear cabinet frame. Closed hollow profiles are expensive to manufacture, particularly when they simply satisfy all requirements for a frame, such as accommodation for assembly over their entire length, simple connection with corner connectors, sealing of attached wall elements and doors, and the like.

Other conventional frame members for a switchgear cabinet frame designed as open hollow profiles may be easier to manufacture with a stamped and bent part, but do not easily fulfill all the requirements of a switchgear cabinet frame.

SUMMARY OF THE INVENTION

One purpose of this invention is to provide a frame member of a general type mentioned above, which, as a simply-manufactured hollow profile section, satisfies in a simple way all the requirements made of a switchgear cabinet frame.

The above object is achieved according to this invention with a frame-member that has a combination of the following features:

a) profile sides that merge into one another via transitional sections positioned vertical with respect to one another, into a connector section positioned at an angle of 135° to both profile sides, b) the profile sides merging, opposite the transitional sides, into externally-open receiving grooves for seal elements, c) connecting with the receiving grooves sections that are positioned vertically and parallel with the associates profile sides, d) the sections positioned parallel to the associated profile sides, having a series of attachment means, and e) connecting with the section positioned parallel to the associated profile sides inwardly-bent terminal sections.

The frame member designed as described above can be manufactured as a simple stamped and bent part or as an extruded section, or by profiling. The profile sides of the frame member with inwardly-bent receiving grooves offer possibilities to accommodate seal elements, which can also be designed as HF-seals. The transitional sections and the connector section provide in the region of the outer edges a receiving means in which hinge and closure elements may be housed. Symmetrically with the diagonal of the cross-section, in the terminal regions of the frame member there are two plug-in receiving means for plug-in sets of corner connectors, so that the frame can easily be assembled with the frame members and correspondingly-designed corner connectors. Both rows of attachment means form, rotated towards the inside, two attachment strips positioned vertically with respect to one another, so that components may be attached to the frame member in two directions.

The frame member of such preferred embodiment is stamped and folded from a sheet metal strip or is produced as an extruded section.

According to one preferred embodiment of this invention, the corner connectors are attached by the sections positioned vertically to and parallel with the associated profile sides, with the receiving grooves and the terminal sections, plug-in receiving means for plug-in sets of corner connectors.

The receiving grooves in the profile sides are formed by three sections respectively positioned at right angles with respect to one another.

According to another preferred embodiment, the transition from the receiving grooves to the continuing sections is so constructed that the sections positioned vertically with respect to the profile sides are formed with sections of the receiving grooves in a two-layered fashion.

Furthermore, the transitional sections and the connector section form, towards the outer edges of the hollow profile section, a receiving means for folded-over edges of wall elements or of a door.

The plug-in receiving means for the plug-in sets or the corner connectors are improved because the terminal sections stand vertically with respect to the connector section or vertically with respect to the associated profile sides.

The design of the frame member can be in the form of an open hollow profile section or a closed hollow profile section.

BRIEF DESCRIPTION OF THE DRAWINGS

This invention will be explained in more detail with reference to embodiments explained by way of example and shown in the drawings, wherein.

DESCRIPTION OF PREFERRED EMBODIMENTS

Figure 1:
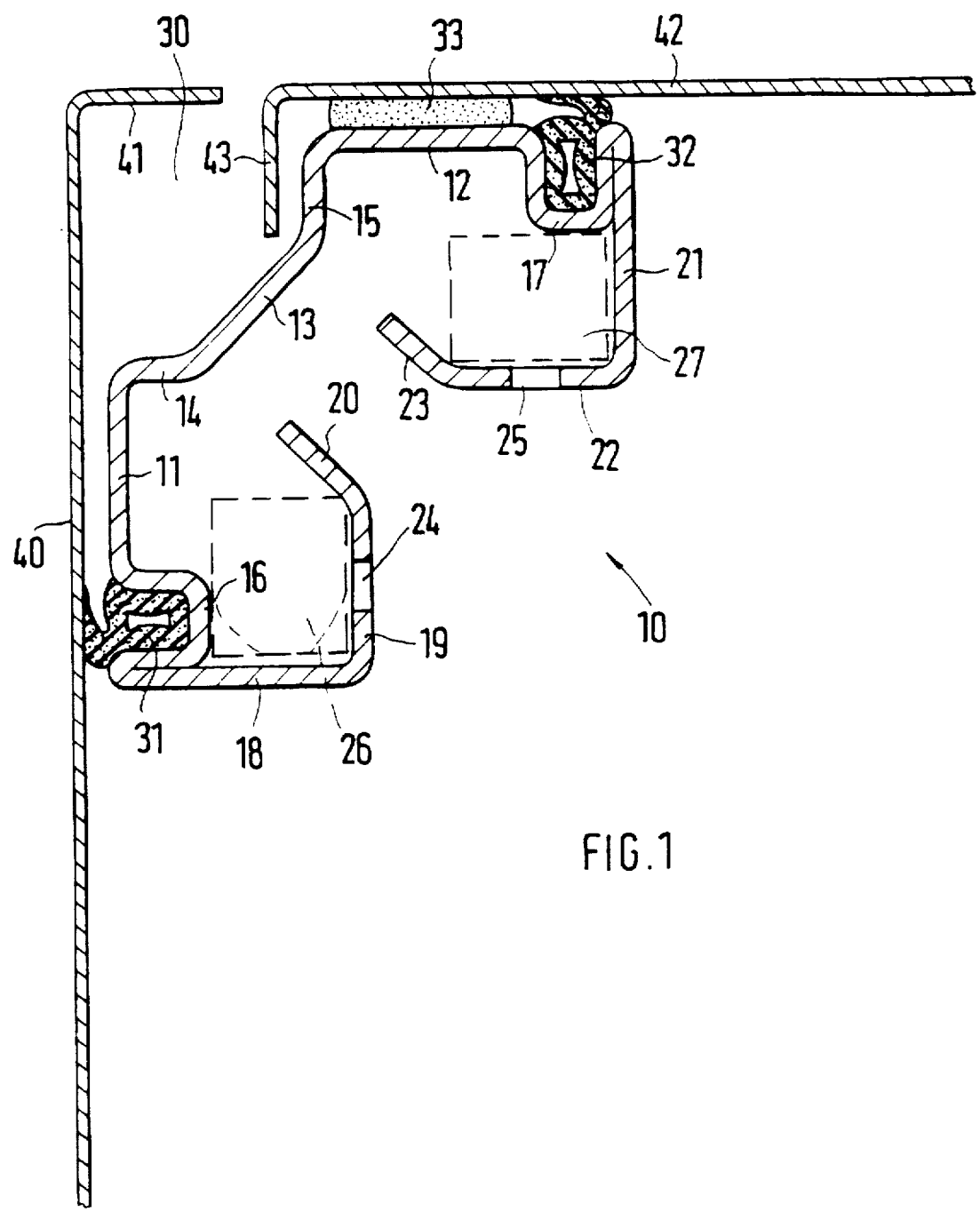
FIG. 1 is a partial view of a frame member shown in cross-section, as an open hollow profile section.

The frame member shown in FIG. 1 is produced, for example, from a sheet metal strip by stamping and bending as an open hollow profile section 10. The hollow profile section 10 does not have a formed outer edge, but is formed symmetrically about a diagonal. During assembly of the frame member, an open side of the hollow profile section 10 is rotated inwards. Two profile sides 11 and 12, positioned vertically with respect to one another, form in a known manner the outer sides of the frame member, but do not extend as far as an outer edge. The profile sides 11 and 12 are interconnected by transitional sections 14 and 15 positioned vertically and by a connector section 13. Therefore in the corner area there is a receiving means 30, which houses not only hinge and closure elements but also folded edges 41 and 43 of doors 40 and wall elements 42, respectively.

Facing away from the transitional elements 14 and 15, the profile sides 11 and 12 merge into U-shaped receiving grooves 16 and 17, formed by three sections respectively positioned at right angles with respect to one another. The receiving grooves 16 and 17 accommodate seal members 31 and 32, which abut seal lips at the doors 41 and wall elements 42, respectively. As shown by a seal strip 33, either of the profile sides 11 and 12 can support the seal strip 33, which is particularly useful for alignment of the frame members.

Connecting with the receiving grooves 16 and 17, sections 18 and 21 are inwardly angled vertically with respect to the profile sides 11 and 12, and are in a double-layered form with the adjacent section of the receiving grooves 16 and 17. Connecting with the sections 18 and 21 are sections 19 and 22, respectively, which are parallel to the corresponding profile sides 11 and 12 and which have a series of attachment means 24 and 25.

Finally, the terminal sections 20 and 23 respectively connecting with the sections 19 and 22 form, with the sections 18 and 19 or 21 and 22 and the receiving grooves 16 and 17, receiving means 26 and 27 for plug-in sets of corner connectors, as shown in dashed lines. The terminal sections 20 and 23 are aligned parallel to one another and positioned vertically with respect to the connector section 13. In another preferred embodiment, the terminal sections 20 and 23 stand vertical to the associated profile sides 11 and 12 and thus better surround plug-in sets mounted within the corner connectors.

The sections 19 and 22 form, with rows of attachment means 24 and 25 over an entire length of the hollow profile section 10, attachment means in two seals positioned vertically with respect to one another. In this case additional assembly rails may simultaneously be connected with the sections 19 and 22, to reinforce the hollow profile section 10.

Figure 2:
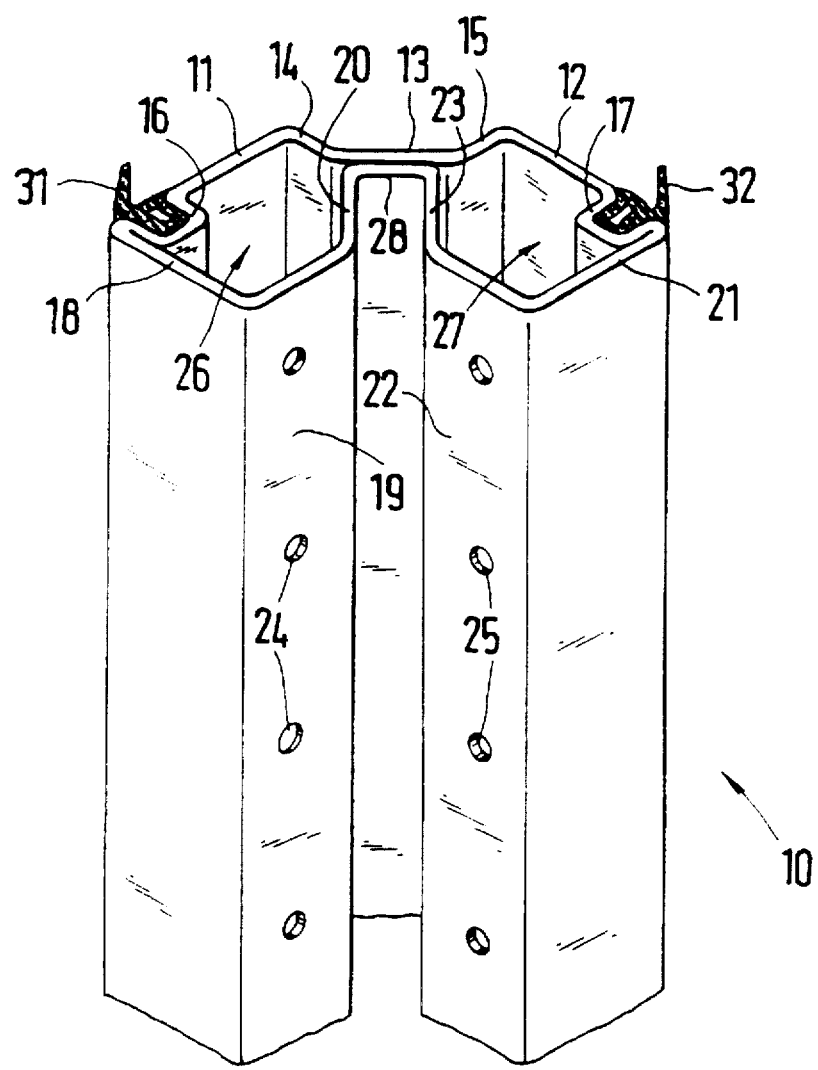
FIG. 2 is a partial perspective view of a portion of a frame member in the shape of a closed hollow profile section.

In the embodiment shown in FIG. 2 there is a frame member 10, formed as a closed hollow profile section, which can be produced as an extruded section. The difference from the frame member 10 shown in FIG. 1 resides in the fact that the terminal sections 20 and 23 are positioned vertically to the connector section 13 and are interconnected by a section 28. The section 28 can be connected to the connector section 13. The section 28 can also comprise two part-sections, which connect to the terminal sections 20 and 23. The receiving means 26 and 27 for plug-in sets of a corner connector can also include the profile sides 11 and 12 and the transitional sections 13 and 14. However, two receiving means remain for two plugin sets, although with a different cross-section. Moreover, the frame member according to FIG. 2 satisfies all the requirements made of a frame member.

We claim:

1. A frame member for a switchgear cabinet frame, having two profile sides positioned vertically to one another, forming outer sides of a frame member, and which is formed as a hollow profile section which forms a receiver, wherein the improvement comprises:

the profile sides (11, 12) merging into one another by way of a plurality of transitional sections (14, 15) positioned vertically with respect to one another and into a connector section (13) positioned at an angle of about 135° with respect to the profile sides (11, 12);

each of the profile sides (11, 12) merging opposite the transitional sections (14, 15), into a corresponding one of a plurality of receiving grooves (16, 17) for accommodating one of a plurality of seal elements (31,32);

connecting with the receiving grooves (16, 17) are a plurality of sections (18, 19; 21, 22) positioned vertically with respect to the associated profile sides (11, 12);

two first sections (19, 22) of the sections (18, 19; 21, 22) positioned parallel with respect to the associated profile sides (11, 12) and having a plurality of attachment means (24, 25); and a plurality of inwardly angled terminal sections (20, 23) connected to the first sections (19,22) of the sections (18, 19; 21, 22) which are positioned parallel to the corresponding profile sides (11, 12).

2. A frame member according to claim 1, wherein the frame member is stamped and bent from a sheet metal strip.

3. A frame member according to claim 2, wherein the sections (18, 19; 21, 22), the receiving grooves (16, 17), and the terminal sections (20, 23) define plug-in receiving means (26, 27) for accommodating a plug-in set of a corner connector.

4. A frame member according to claim 3, wherein a side surface of each of the profile sections (11, 12) is connected to a seal strip (33).

5. A frame member according to claim 4, wherein the receiving grooves (16, 17) are formed by three sections positioned at right angles with respect to one another.

6. A frame member according to claim 5, wherein two second sections (18, 21) of the sections (18, 19; 21, 22) are formed in a double layer with sections of the receiving grooves (16, 17).

7. A frame member according to claim 6, wherein the transitional sections (14, 15) and the connector section (13) form, towards outer edges of the hollow profile section (10), a receiving means (30) for receiving a folded edge (41, 43) of one of a wall element (42) and a door (40).

8. A frame member according to claim 7, wherein the terminal sections (20, 23) are perpendicular with respect to one of the connector section (13) and the profile sides (11, 12).

9. A frame member according to claim 8, wherein the frame member has a form of one of an open hollow profile section and a closed hollow profile section.

10. A frame member according to claim 1, wherein the frame member is manufactured as an extruded section.

11. A frame member according to claim 1, wherein the sections (18, 19; 21, 22), the receiving grooves (16, 17), and the terminal sections (20, 23) define plug-in receiving means (26, 27) for accommodating a plug-in set of a corner connector.

12. A frame member according to claim 1, wherein a side surface of each of the profile sections (11, 12) is connected to a seal strip (33).

13. A frame member according to claim 1, wherein the receiving grooves (16, 17) are formed by three sections positioned at right angles with respect to one another.

14. A frame member according to claim 1, wherein two second sections (18, 21) of the sections (18, 19; 21 22) are formed in a double layer with sections of the receiving grooves (16, 17).

15. A frame member according to claim 1, wherein the transitional sections (14, 15) and the connector section (13) form, towards outer edges of the hollow profile section (10), a receiving means (30) for receiving a folded edge (41, 43) of one of a wall element (42) and a door (40).

16. A frame member according to claim 1, wherein the terminal sections (20, 23) are perpendicular with respect to one of the connector section (13) and the profile sides (11, 12).

17. A frame member according to claim 1, wherein the frame member has a form of one of an open hollow profile section and a closed hollow profile section.

* * * * *